(12) United States Patent
Shohda et al.

(10) Patent No.: US 9,531,152 B2
(45) Date of Patent: Dec. 27, 2016

(54) WAVEGUIDE LASER

(71) Applicant: Mitsubishi Electric Corporation, Tokyo (JP)

(72) Inventors: Fumio Shohda, Tokyo (JP); Takayuki Yanagisawa, Tokyo (JP); Kyosuke Kuramoto, Tokyo (JP); Yosuke Akino, Tokyo (JP); Kohei Sakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/891,027

(22) PCT Filed: Jun. 6, 2013

(86) PCT No.: PCT/JP2013/065714
§ 371 (c)(1),
(2) Date: Nov. 13, 2015

(87) PCT Pub. No.: WO2014/196062
PCT Pub. Date: Dec. 11, 2014

(65) Prior Publication Data
US 2016/0087396 A1    Mar. 24, 2016

(51) Int. Cl.
*H01S 3/109*    (2006.01)
*H01S 3/063*    (2006.01)
(Continued)

(52) U.S. Cl.
CPC ............ *H01S 3/109* (2013.01); *G02F 1/3558* (2013.01); *H01S 3/063* (2013.01);
(Continued)

(58) Field of Classification Search
CPC .. H01S 3/109; H01S 3/08086; H01S 3/08009; H01S 3/063; H01S 3/08059; G02F 1/3558
See application file for complete search history.

(56) References Cited

U.S. PATENT DOCUMENTS 5,233,620 A    8/1993    Shinozaki et al.
5,502,738 A *  3/1996    Hyuga ............... H01S 3/08036
                                                    372/105

(Continued)

FOREIGN PATENT DOCUMENTS

JP    04-107536 A    4/1992
JP    07-318996 A    12/1995
(Continued)

OTHER PUBLICATIONS

International Search Report, PCT/JP2013/065714, Dec. 3, 2013.

*Primary Examiner* — Xinning Niu
(74) *Attorney, Agent, or Firm* — Studebaker & Brackett PC

(57) ABSTRACT

A laser includes a wavelength selecting element 14 that selectively reflects laser beams with wavelengths $\lambda=\lambda_0, \lambda_1, \lambda_2, \ldots, \lambda_n$ ($n \geq 1$) of different laser oscillation modes from among fundamental oscillation wavelengths of laser beams passing through a wavelength conversion element 13, and the wavelength conversion element 13 that converts the laser beams with the wavelengths $\lambda=\lambda_0, \lambda_1, \lambda_2, \ldots, \lambda_n$ ($n \geq 1$) of different laser oscillation modes reflected by the wavelength selecting element 14 to harmonics. When using a material with a wide gain band as a laser medium 121 of a solid-state laser element 12, a waveguide laser is implemented capable of carrying out high-efficiency wavelength conversion at a plurality of wavelengths within the gain band.

5 Claims, 6 Drawing Sheets

(51) Int. Cl.
*H01S 3/08* (2006.01)
*G02F 1/355* (2006.01)

(52) U.S. Cl.
CPC ...... *H01S 3/08009* (2013.01); *H01S 3/08086* (2013.01); *H01S 3/08059* (2013.01)

(56) References Cited

U.S. PATENT DOCUMENTS

| | | |
|---|---|---|
| 5,617,435 A | 4/1997 | Nagai et al. |
| 2007/0121685 A1 | 5/2007 | Maekawa |
| 2007/0133628 A1 | 6/2007 | Komatsu et al. |
| 2010/0220384 A1* | 9/2010 | Kimura ................ G02B 26/123 |
| | | 359/328 |
| 2010/0303108 A1 | 12/2010 | Koyata et al. |
| 2012/0105943 A1 | 5/2012 | Hatanaka |

FOREIGN PATENT DOCUMENTS

| | | |
|---|---|---|
| JP | 2007-165562 A | 6/2007 |
| JP | 2007-173769 A | 7/2007 |
| JP | 2012-098495 A | 5/2012 |
| JP | 5159783 B | 12/2012 |
| WO | 2009034625 A1 | 3/2009 |

\* cited by examiner

WAVEGUIDE LASER

TECHNICAL FIELD

The present invention relates to a waveguide laser that carries out wavelength conversion of laser beams within a planar waveguide.

BACKGROUND ART

A device such as a printer and projection television, which displays a color image requires a light source with the three colors R (red), G (green) and B (blue).

Recently, as a light source of this type, a wavelength conversion laser (laser oscillator) has been developed which uses laser beams of the 900 nm band, 1 μm band and 1.3 μm band as the fundamental wave laser beams, and converts the fundamental wave laser beams to the second harmonics with half the wavelengths (double frequency) using a nonlinear material (SHG: Second Harmonic Generation).

To extract the laser beams with the desired wavelengths at high efficiency, it is necessary for the SHG to achieve high conversion efficiency from the fundamental wave laser beams to the second harmonic laser beams.

To convert the fundamental wave laser beams to the second harmonic laser beams within the wavelength conversion element, phase matching conditions must be satisfied between the fundamental wave laser beams before the conversion and the second harmonic laser beams after the conversion.

The phase matching conditions are conditions that correct the phase shift between the fundamental wave laser beams and the second harmonic laser beams between the wavelength conversion element.

As an element that carries out the wavelength conversion while satisfying the phase matching conditions, a quasi phase matching (QPM) wavelength conversion element using a periodic structure is known, for example.

The QPM wavelength conversion element has an optical waveguide formed in a periodically poled lithium niobate (PPLN) which is a nonlinear optical crystal, and inverts its polarization periodically along the waveguide direction.

The following Patent Document 1 proposes, as for a planar waveguide-type wavelength conversion element that has a flat nonlinear optical material and propagates the fundamental waves of laser beams in a plurality of laser oscillation modes in the direction perpendicular to a flat main surface perpendicular to the optical axis to perform the wavelength conversion of the fundamental waves, a wavelength conversion element and a wavelength conversion laser wherein the nonlinear optical material has non-polarization inversion regions and polarization inversion regions formed therein by varying their polarization inversion periods in such a manner that the nonlinear optical material has a phase matching bandwidth including the phase matching conditions of at least two laser oscillation modes among the plurality of laser oscillation modes.

The wavelength conversion element in the Patent Document 1 modifies the polarization inversion periods of the nonlinear optical material to obtain the phase matching bandwidth including the phase matching conditions of at least two laser oscillation modes. Thus it can carry out the wavelength conversion of the fundamental wavelengths for at least two laser oscillation modes.

PRIOR ART DOCUMENT

Patent Document

Patent Document 1: WO2009/034625.

DISCLOSURE OF THE INVENTION

Problems to be Solved by the Invention

The wavelength conversion laser of the foregoing Patent Document 1 can increase the fundamental wavelength band undergoing the wavelength conversion by gradually varying the pitch of the polarization inversion period of the wavelength conversion element.

However, the conversion efficiency of the wavelength conversion element with its pitch of the polarization inversion period being gradually varied is lower than that of a wavelength conversion element with a fixed polarization inversion period.

Thus a problem arises in that it is difficult to achieve both the wide fundamental wave conversion wavelength band and the high conversion efficiency simultaneously.

The present invention is implemented to solve the foregoing problem. Therefore it is an object of the present invention to provide a waveguide laser capable of achieving the wavelength conversion at high efficiency at a plurality of wavelengths when using a material with a wide gain band as a laser medium.

Means for Solving the Problem

A waveguide laser in accordance with the present invention comprises a wavelength selecting element that selectively reflects laser beams with wavelengths $\lambda=\lambda_0, \lambda_1, \lambda_2, \ldots, \lambda_n$ ($n \geq 1$) of different laser oscillation modes from among fundamental oscillation wavelengths of the laser beams passing through a wavelength conversion element; and the wavelength conversion element that converts the laser beams with the wavelengths $\lambda=\lambda_0, \lambda_1, \lambda_2, \ldots, \lambda_n$ ($n \geq 1$) of the different laser oscillation modes reflected by the wavelength selecting element to harmonics.

Advantages of the Invention

According to the present invention, it offers an advantage of being able to carry out the wavelength conversion at high efficiency at a plurality of wavelengths when using a material with a wide gain band as the laser medium of a solid-state laser element.

BEST MODE FOR CARRYING OUT THE INVENTION

The best mode for carrying out a waveguide laser in accordance with the present invention will now be described with reference to the accompanying drawings.

In the following description, the same reference symbols designate the same or like components throughout the drawings.

Incidentally, the present invention is not limited by the embodiment.

Embodiment 1

Figure 1:
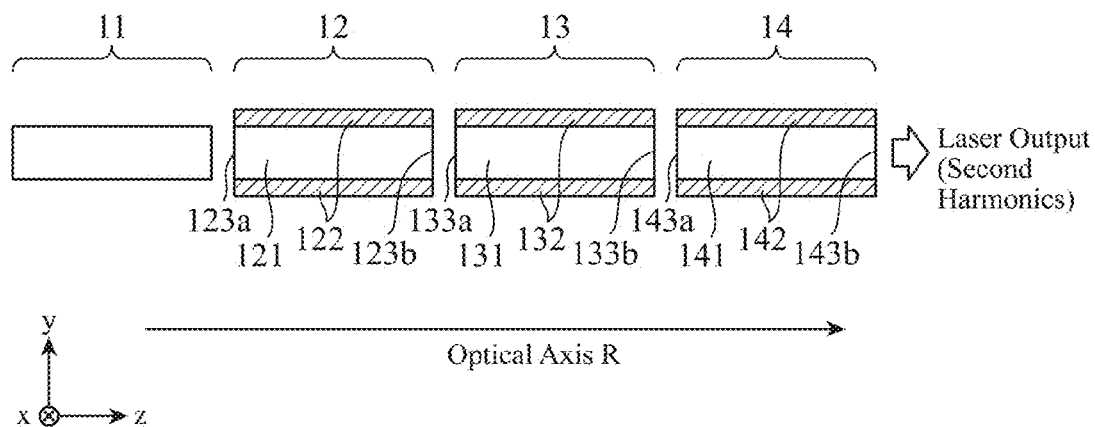
FIG. 1 is a side cross sectional view of a waveguide laser of an embodiment 1 in accordance with the present invention.
Figure 2:
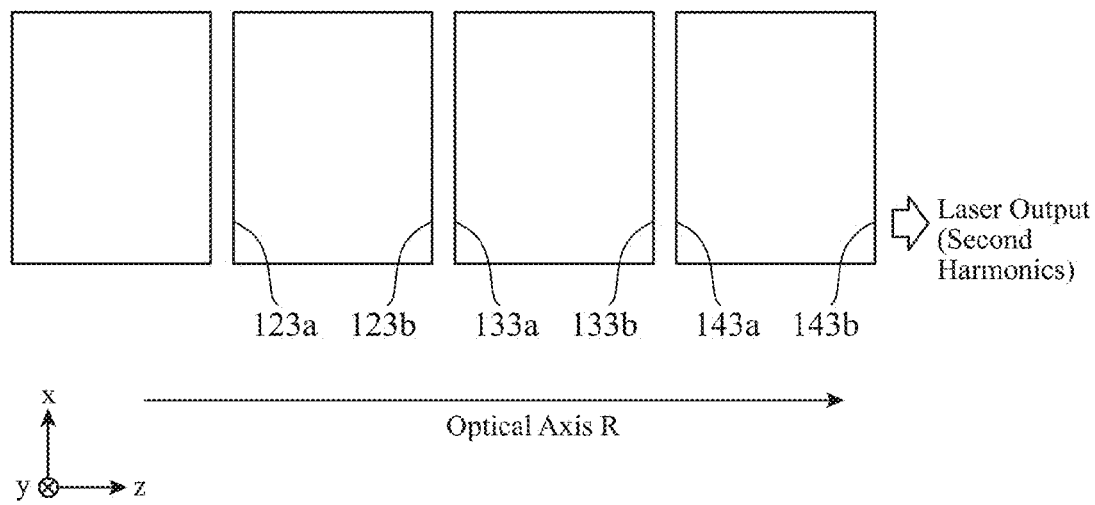
FIG. 2 is a top view showing the waveguide laser of the embodiment 1 in accordance with the present invention.
Figure 3:
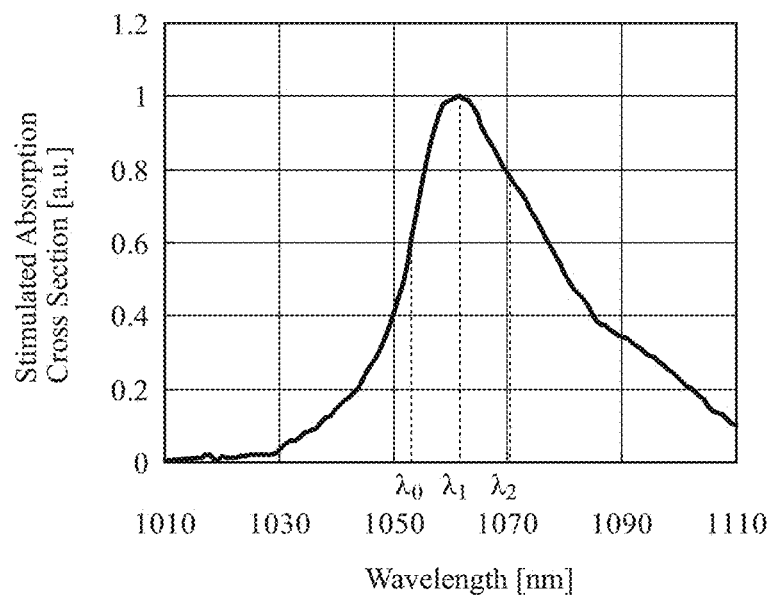
FIG. 3 is a characteristic diagram illustrating an example of wavelength dependence of a stimulated absorption cross section of a laser medium.

FIG. 1 is a cross-sectional view showing a structure of a waveguide laser of an embodiment 1 in accordance with the present invention seen from its side, and FIG. 2 is a top view showing the structure of the waveguide laser.

Incidentally, FIG. 1 and FIG. 2 show an optical axis R representing the laser oscillation direction.

The waveguide laser comprises a semiconductor laser 11, a solid-state laser element 12, a wavelength conversion element 13, and a wavelength selecting element 14.

The semiconductor laser 11 emits a single or a plurality of LD (Laser Diode) beams from a single or a plurality of active layers.

When the semiconductor laser 11 outputs a plurality of LD beams, it emits the LD beams in an array fashion to cause the solid-state laser element 12 to carry out multi-emitter oscillations.

The solid-state laser element 12, which oscillates fundamental wave laser beams, comprises a laser medium 121 and a cladding (low refractive index region) 122.

The wavelength conversion element 13 is an element that converts the fundamental wave laser beams oscillated to second harmonic laser beams, and emits the second harmonic laser beams after the conversion.

The wavelength conversion element 13, which has a slab waveguide structure, comprises a nonlinear optical material 131 and a cladding 132.

The wavelength selecting element 14, which has a slab waveguide structure, comprises a VBG (Volume Bragg Grating) 141 as a volume phase grating having a Bragg grating structure formed therein and a cladding 142.

For convenience of explanation, the following description will be made on the assumption that the optical axis R represents the z-axis direction, the direction perpendicular to the main surface of the waveguide laser represents the y-axis direction, and the direction perpendicular to both the y-axis and z-axis (the width direction of the wavelength conversion element 13 and the like) represents the x-axis direction.

The semiconductor laser 11, laser medium 121, nonlinear optical material 131, and VBG 141 each have a form of an approximately rectangular flat plane, and the main surface of each flat plane is disposed in parallel with the xz plane (juxtaposed on a single plane).

The laser medium 121 has its first side face (end face 123a perpendicular to the z-axis) disposed close to the semiconductor laser 11, and has its second side face opposing to the first side face (end face 123b perpendicular to the z-axis) disposed close to the nonlinear optical material 131.

The nonlinear optical material 131 has its first side face (end face 133a perpendicular to the z-axis) disposed close to the end face 123b of the laser medium 121 and has its second side face opposing the first side face (end face 133b perpendicular to the z-axis) disposed close to the VBG 141.

The VBG 141 has its first side face (end face 143a perpendicular to the z-axis) disposed close to the end face 133b of the nonlinear optical material 131, and causes its side face opposing the first side face (end face 143b perpendicular to the z-axis) to emit the second harmonic laser beams.

The adjacent faces between the semiconductor laser 11 and the laser medium 121 have approximately the same plane shape (approximately a rectangular form) between the semiconductor laser 11 and the laser medium 121; the adjacent faces between the laser medium 121 and the nonlinear optical material 131 have approximately the same plane shape (approximately a rectangular form) between the laser medium 121 and the nonlinear optical material 131; and the adjacent faces between the nonlinear optical material 131 and the VBG 141 have approximately the same plane shape (approximately a rectangular form) between the nonlinear optical material 131 and the VBG 141.

In other words, in the waveguide laser, the semiconductor laser 11, solid-state laser element 12, wavelength conversion element 13, and wavelength selecting element 14 are disposed in such a manner that the emitting face of the semiconductor laser 11, the end faces 123a and 123b of the laser medium 121, the end faces 133a and 133b of the nonlinear optical material 131, and the end faces 143a and 143b of the VBG 141 become parallel to each other.

The semiconductor laser 11 can have a heat sink (not shown) joined thereto for cooling as the need arises.

The width of the semiconductor laser 11 in the x-axis direction is approximately equal to the width of the laser medium 121 in the x-axis direction, and the semiconductor laser 11 emits the excitation light approximately uniform in the x-axis direction.

The semiconductor laser 11 is, for example, a multi-emitter semiconductor laser which has a plurality of active layers disposed for outputting the LD beams.

When the semiconductor laser 11 is a multi-emitter semiconductor laser, the active layers are arranged in the semiconductor laser 11 in such a manner that the active layers are aligned in the x-axis direction of the laser beam emitting face.

In this case, since the semiconductor laser 11 emits a plurality of LD beams from the plurality of active layers, the solid-state laser element 12 can acquire the laser output beams from the plurality of active layers aligned in the x-axis direction.

The LD beams emitted from the semiconductor laser 11 are incident on the xz plane of the laser medium 121 through the end face 123a (in the direction of the optical axis R perpendicular to the xy plane) to be absorbed into the laser medium 121.

The end face 123a of the laser medium 121 is a total reflection film that reflects the fundamental wave laser beams, the end face 123b of the laser medium 121 is an antireflection film that transmits the fundamental wave laser beams.

The end face 133a of the nonlinear optical material 131 is an optical film that transmits the fundamental wave laser beams, but reflects the second harmonic laser beams. The end face 133b of the nonlinear optical material 131 is an optical film that transmits both the fundamental wave laser beams and the second harmonic laser beams.

The end face 143a of the VBG 141 is an optical film that transmits the fundamental wave laser beams and the second harmonic laser beams, and the end face 143b of the VBG is an optical film (partial reflection film) that reflects the fundamental wave laser beams, but transmits the second harmonic laser beams.

The total reflection film, antireflection film, and optical film are fabricated by stacking dielectric thin films, for example.

Incidentally, when launching the excitation light emitted from the semiconductor laser 11 into the end face 123a of the laser medium 121, the total reflection film of the end face 123a works as an optical film that transmits the excitation light but reflects the fundamental wave laser beams.

The laser medium 121 has the dimensions of several to several tens of micrometers thick in the y-axis direction, and several hundred micrometers to several millimeters wide in the x-axis direction.

As for the laser medium 121, although a material with a wide gain band is suitable, it is not limited to that. For example, a common solid-state laser material can be used.

For example, the laser medium 121 can be a Nd:YAG; Nd:YLF; Nd:Glass; Nd:YVO4; Nd:GdVO4; Yb:YAG; Yb:YLF; Yb:KGW; Yb:KYW; Er:Glass; Er:YAG; Tm:YAG; Tm:YLF; Ho:YAG; Ho:YLF; Tm, Ho:YAG; Tm, Ho:YLF; Ti:Sapphire; or Cr:LiSAF.

The cladding 122 has a refractive index less than that of the laser medium 121, and has its planes (the top face of the cladding 122 and the undersurface of the cladding 122) parallel to the xz plane of the laser medium 121 joined to the main surfaces of the laser medium 121.

The cladding 122 is fabricated by a method of evaporating a film of an optical material onto the laser medium 121, or by a method of optically joining an optical material to the laser medium 121 using optical contact or diffused junction.

The underside of the cladding 122 can be joined to a heat sink (not shown) for cooling.

The nonlinear optical material 131 carries out wavelength conversion of the fundamental wave laser beams incident thereon from the laser medium 121 side, and emits the second harmonic laser beams.

The nonlinear optical material 131 has dimensions of several to several tens of micrometers thick in the y-axis direction, and several hundred micrometers to several millimeters wide in the x-axis direction.

As for the nonlinear optical material 131, a common material for the wavelength conversion can be used.

For example, the nonlinear optical material 131 can be KTP, KN, BBO, LBO, CLBO, LiNbO3, or LiTaO3.

In addition, using MgO-doped LiNbO3, MgO-doped LiTaO3, stoichiometric LiNbO3, or stoichiometric LiTaO3, which is resistant to an optical damage, as the nonlinear optical material 131 enables increasing the power density of the incident fundamental wave laser beams. This makes it possible to carry out the wavelength conversion at high efficiency.

Furthermore, using MgO-doped LiNbO3, MgO-doped LiTaO3, stoichiometric LiNbO3, stoichiometric LiTaO3, or KTP with a periodically inverted polarization structure as the nonlinear optical material 131 enables efficient wavelength conversion higher than MgO-doped LiNbO3 or the like because they have a greater nonlinear constant.

The cladding 132 has a refractive index less than the nonlinear optical material 131, and has its planes (the top face of the cladding 132 and the undersurface of the cladding 132) parallel to the xz plane of the nonlinear optical material 131 joined to the main surfaces of the nonlinear optical material 131.

The cladding 132 is fabricated, for example, by a method of evaporating a film of an optical material onto the nonlinear optical material 131, or by a method of optically joining an optical material to the nonlinear optical material 131 using optical contact or diffused junction.

The VBG 141 reflects only specific wavelengths among the fundamental wave laser beams incident thereon from the nonlinear optical material 131 side.

The VBG 141 has dimensions of several to several tens of micrometers thick in the y-axis direction, and several hundred micrometers to several millimeters wide in the x-axis direction.

For example, it is made of an inorganic material using silica-based glass as a main material, and periodic refractive index variation is formed along the optical axis by ultraviolet radiation and heat treatment.

Thus forming a periodic refractive index modification structure can provide a configuration that reflects the specific wavelengths intensely by Bragg reflection.

Among the oscillation wavelengths of the fundamental wave laser beams, the reflection waves are laser beams with wavelengths $\lambda=\lambda_0, \lambda_1, \lambda_2, \ldots, \lambda_n$ ($n \geq 1$) in different laser oscillation modes, which are stabilized with the wavelength width of 0.1 nm each.

The cladding 142 has a refractive index lower than that of the VBG 141, and has its planes (the top face of the cladding 142 and the undersurface of the cladding 142) parallel to the xz plane of the VBG 141 joined onto the main surfaces of the VBG 141.

The cladding 142 is fabricated, for example, by a method of evaporating a film of the optical material onto the VBG 141, or by a method of optically joining the optical material to the VBG 141 using optical contact or diffused junction.

According to the present embodiment 1, within the oscillation wavelength band of the fundamental wave laser beams the solid-state laser element 12 can generate, and among the fundamental oscillation wavelengths emitted from the solid-state laser element 12, the wavelength selecting element 14 selectively reflects the laser beams with the wavelengths $\lambda=\lambda_0, \lambda_1, \lambda_2, \ldots, \lambda_n$ ($n \geq 1$) of different laser oscillation modes, and launches them into the wavelength conversion element 13.

The wavelength conversion element 13 employs a QPM wavelength conversion element (quasi phase matching wavelength conversion element) to achieve high conversion efficiency.

As for the laser beams with the wavelengths $\lambda=\lambda_0, \lambda_1, \lambda_2, \ldots, \lambda_n$ ($n \geq 1$) of different laser oscillation modes launched into the wavelength conversion element 13, they are formed with the wavelength conversion element and waveguide structure whose polarization inversion period is determined in such a manner that they are each placed within the phase matching band.

As an example of the wavelength dependence of a stimulated absorption cross section of the laser medium 121, FIG.

3 shows the wavelength dependence of the stimulated absorption cross section of a Nd:Glass.

It is desirable that the laser medium 121 have a wide gain band. As for the beams with the wavelengths $\lambda = \lambda_0, \lambda_1, \lambda_2, \ldots, \lambda_n$ ($n \geq 1$) within the oscillation wavelength band of the fundamental wave laser beams, a case will be described in which they are limited to three wavelengths $\lambda_0, \lambda_1, \lambda_2$, for example, and their second harmonic beams ($\lambda_0/2, \lambda_1/2, \lambda_2/2$) are obtained.

The laser medium 121 forms a population inversion state by the excitation light from the semiconductor laser 11, and undergoes amplification by the excitation light because of the stimulated emission.

Although the laser beams make a round-trip between the end face 123a of the laser medium 121 and the VBG 141 of the wavelength selecting element 14, if the gain due to the amplification during the single round-trip through the optical resonator matches the loss during the round-trip through the optical resonator, the fundamental wave laser beams make a laser oscillation.

Figure 4:
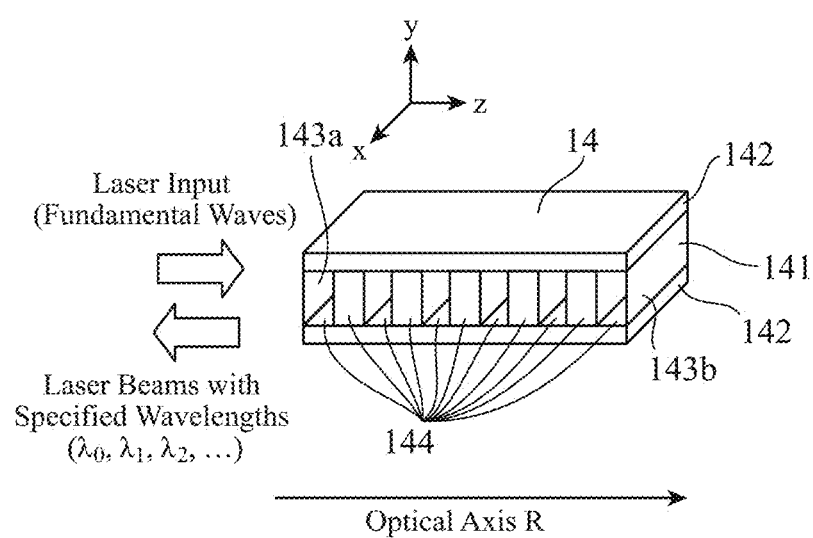
FIG. 4 is a perspective view showing a wavelength selecting element.

FIG. 4 is a perspective view showing a structure of the wavelength selecting element 14.

As shown in FIG. 4, the VBG 141 of the wavelength selecting element 14 has a plurality of Bragg layers 144.

The Bragg layers 144 are approximately flat each, and the flat main surfaces are sandwiched by the cladding 142 in such a manner that they are arranged in parallel with the x-axis direction and y-axis direction.

As for the wavelength selecting element 14, its Bragg grating structure is set up so as to reflect the laser beams with the wavelengths $\lambda_0, \lambda_1, \lambda_2$ within the oscillation wavelength band, which are the fundamental waves (fundamental wave laser beams) from the laser medium 12, pass through the wavelength conversion element 13, and then are supplied to the end face 143a.

The reflected fundamental wave laser beams with the wavelengths $\lambda_0, \lambda_1, \lambda_2$ are incident onto the end face 133b of the nonlinear optical element 131.

Although the present embodiment 1 is described on the assumption that the wavelength selecting element 14 has a waveguide structure comprising the VBG 141 as its core, this is not essential. For example, as long as it can reflect the wavelengths $\lambda_0, \lambda_1, \lambda_2$ among the fundamental waves such as a reflector, it is applicable.

However, using a waveguide structure having a narrow-band VBG 141 as its core enables selecting the laser oscillation mode at each wavelength.

Thus, the wavelength selecting element 14 can be provided not only with a function of selecting the laser beams with the wavelengths $\lambda = \lambda 0, \lambda 1, \lambda 2, \ldots, \lambda n$ ($n \geq 1$), but also with the function of mode selection that selects a specific mode of each wavelength and reflects.

Figure 5:
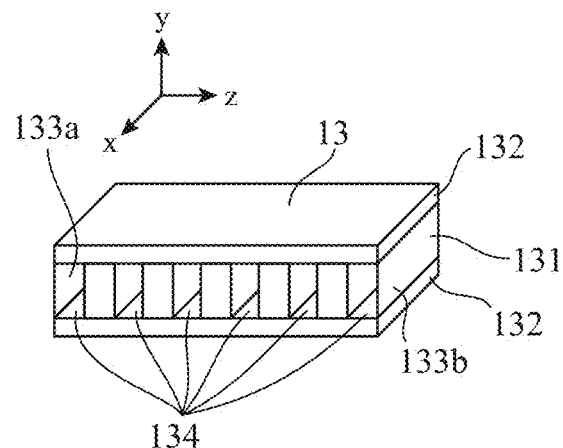
FIG. 5 is a perspective view showing a wavelength conversion element.

FIG. 5 is a perspective view showing a structure of the wavelength conversion element 13.

As shown in FIG. 5, the nonlinear optical material 131 of the wavelength conversion element 13 comprises a plurality of polarization inversion layers 134.

The polarization inversion layers 134 has an arrangement of inverted polarization of a single crystal dielectric material polarized in a fixed direction.

In the nonlinear optical material 131, the non-polarization inversion regions and the polarization inversion regions (polarization inversion layers 134) are formed alternately.

Thus, the nonlinear optical material 131 has the polarization inversion layers 134 formed therein periodically.

The individual polarization inversion layers 134 are approximately flat, and are sandwiched by the cladding 132 in such a manner that their flat main surfaces are arranged in parallel with the x-axis direction and y-axis direction.

In the nonlinear optical material 131, among the fundamental waves (fundamental wave laser beams) from the laser medium 121, the laser beams with the wavelengths $\lambda_0, \lambda_1, \lambda_2$ which are reflected by the VBG 141 are incident on its end face 133b, and the laser beams which are reflected by the VBG 141, then reflected off the end face 123a of the laser medium 121, and incident on the end face 133a, are propagated sequentially through the non-polarization inversion region and polarization inversion region arranged alternately.

When the fundamental wave laser beams with the wavelengths $\lambda_0, \lambda_1, \lambda_2$ reflected by the VBG 141 are incident on the nonlinear optical material 131, the nonlinear optical material 131 converts the fundamental wave laser beams to the second harmonic laser beams by its nonlinear effect.

In the nonlinear optical material 131, to achieve the conversion of the fundamental wave laser beams with the wavelengths $\lambda_0, \lambda_1, \lambda_2$ reflected by the VBG 141 to the second harmonic laser beams, the crystallographic axis angle, the temperature and the period of the inversion polarization are optimized in advance.

The fundamental wave laser beams incident to the nonlinear optical material 131 have their parts converted to the second harmonic laser beams to be propagated through the VBG 141 and output from the end face 143b as laser beams.

Parts of the fundamental wave laser beams which are not converted to the second harmonic laser beams and remain in the nonlinear optical material 131 or in the VBG 141 are reflected within the VBG 141, pass through the nonlinear optical material 131 again, and are converted to the second harmonic laser beams.

The second harmonic laser beams generated by the conversion of the parts of the residual fundamental wave laser beams are totally reflected by the end face 133a and are output from the end face 143b as the laser beams.

Figure 6:
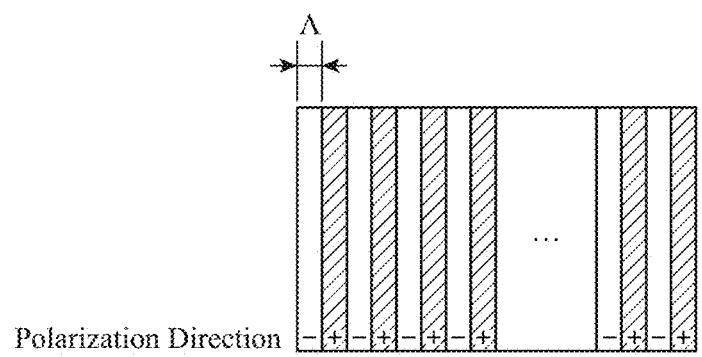
FIG. 6 is a diagram showing a polarization inversion pattern of the wavelength conversion element.

FIG. 6 is a diagram for explaining a polarization inversion pattern of the wavelength conversion element 13.

FIG. 6 shows the polarization inversion pattern seen when looking at the top face (from the y-axis direction) of the nonlinear optical material 131.

The polarization inversion pattern of the nonlinear optical material 131 has a plurality of sets of polarization layers arranged in the z-axis direction in such a manner that each set comprises a plus (+) polarization layer (non-polarization inversion region) and a minus (−) polarization layer (polarization inversion region: polarization inversion layer 134).

In other words, the non-polarization inversion region and the polarization inversion region are disposed alternately in the z-axis direction.

The individual polarization layers are disposed at a polarization inversion period $\Lambda$ from the end face 133a to the end face 133b.

An example will be described in which the polarization inversion has a fixed pitch equal to the polarization inversion period $\Lambda$ to achieve the high conversion efficiency to the second harmonics.

Incidentally, the present invention is also applicable to the case where the pitch of the polarization inversion is gradually varied, which will offer other new advantages.

It will be described later.

Figure 7:
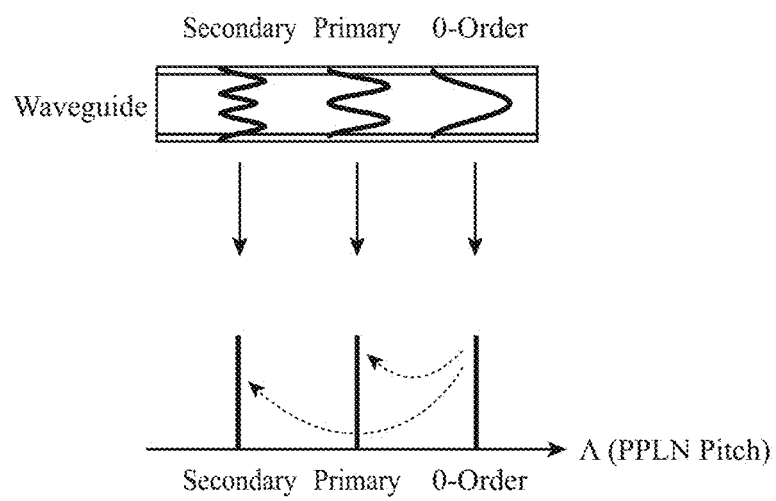
FIG. 7 is a diagram showing transfer of a laser oscillation mode to a higher order mode.

FIG. 7 is a diagram showing the transfer of a laser oscillation mode to a higher order mode.

The wavelength conversion element 13, when it carries out the wavelength conversion within the phase matching band, increases its loss at a phase matching band peak.

This causes the waveguide (nonlinear optical material 131) to transfer the laser oscillation mode from the 0-order mode to the primary mode, for example, and furthermore from the primary mode to the secondary mode, thereby forming a plurality of laser oscillation modes.

As for the laser oscillation modes, since the temperature of the wavelength conversion element suitable for the wavelength conversion differs for each mode in general, the phase matching conditions for the individual modes also differ.

Accordingly, the PPLN pitch (polarization inversion period) differs for each mode in general.

Next, a calculation method of the effective refractive index of each waveguide mode formed in the wavelength conversion element 13, that of the polarization inversion period of the wavelength conversion element 13, and that of the wavelength conversion efficiency will be described.

First, the explanation of the effective refractive index of the waveguide will be given.

Assume that the effective refractive index of the waveguide for the wavelength $\lambda$ of the TM (Transverse Magnetic) m-order mode (m is a natural number) or TE (Transverse Electric) m-order mode is $n_{\mathit{eff}}(\lambda, m)$, then the following relational Expressions (Expression (1) and Expression (2)) hold.

Expression (1) and Expression (2) show relational Expressions when the waveguide is a symmetric 3-layer planar waveguide in which the cladding material refractive indices at the top and bottom of the waveguide are equal.

In the case of TM m-order mode:

$$\frac{\pi t}{\lambda}\sqrt{n_1(\lambda)^2 - n_{\mathit{eff}}(\lambda, m)^2} - \tan^{-1}\left(\frac{n_1(\lambda)^2}{n_2(\lambda)^2}\frac{\sqrt{n_{\mathit{eff}}(\lambda, m)^2 - n_2(\lambda)^2}}{\sqrt{n_1(\lambda)^2 - n_{\mathit{eff}}(\lambda, m)^2}}\right) = \frac{m\pi}{2} \quad (1)$$

In the case of TE m-order mode:

$$\frac{\pi t}{\lambda}\sqrt{n_1(\lambda)^2 - n_{\mathit{eff}}(\lambda, m)^2} - \tan^{-1}\left(\frac{\sqrt{n_{\mathit{eff}}(\lambda, m)^2 - n_2(\lambda)^2}}{\sqrt{n_1(\lambda)^2 - n_{\mathit{eff}}(\lambda, m)^2}}\right) = \frac{m\pi}{2} \quad (2)$$

The term $n_1(\lambda)$ in Expression (1) and Expression (2) is a refractive index for the wavelength $\lambda$ of the core material (nonlinear optical material 131) composing the waveguide, and the term $n_2(\lambda)$ is a refractive index for the wavelength $\lambda$ of the cladding 132 composing the waveguide.

In addition, the term $n_{\mathit{eff}}(\lambda, m)$ is an effective refractive index for the wavelength $\lambda$ (m is the order of the waveguide mode) and t is the thickness of the core composing the waveguide.

Next, the explanation of the polarization inversion period of the wavelength conversion element 13 will be given.

The polarization inversion period $\Lambda$ of the waveguide-type wavelength conversion element 13 can be given by the following relational Expression (Expression (3)) using the effective refractive indices $n_{\mathit{eff}}(\lambda, m)$ of the waveguide for the fundamental wave laser beam and the second harmonic of the m-order mode.

$$\Lambda(\lambda, m) = \frac{\lambda}{2(n_{\mathit{eff}}(\lambda, m) - n_{\mathit{eff}}(\lambda/2, m))} \quad (3)$$

In Expression (3), $\lambda$ is the fundamental wavelength and $\lambda/2$ is the second harmonic wavelength.

Next, the explanation of a formula of the wavelength conversion efficiency will be given.

The wavelength conversion efficiency $\eta$ can be calculated by the following Expression (4) when the polarization inversion period $\Lambda$ is fixed.

$$\eta = \frac{I_{SH}}{I_F} = \frac{8\pi^2 d_{\mathit{eff}}^2}{n_{SH}n_F^2 c\varepsilon_0 \lambda^2}L^2 I_F \mathrm{sinc}^2\left\{\frac{L}{2}(\Delta k - K_0)\right\} \quad (4)$$

In Expression (4), $I_F$ is fundamental wave input power, and $I_{SH}$ is harmonic output power.

In addition, $d_{\mathit{eff}}$ is an effective nonlinear optical constant, and $n_F$ is a refractive index for the fundamental wave.

Furthermore, $n_{SH}$ is a refractive index for the harmonic, and c is the speed of light in a vacuum.

Furthermore, $\varepsilon_0$ is the dielectric constant in a vacuum, and L is an element length.

Furthermore, $\Delta k$ is the difference between the wave number $k_\omega$ of the fundamental wave and the wave number $k_{2\omega}$ of the harmonic, and is expressed by $\Delta k = k_\omega - k_{2\omega}$ which expresses a phase mismatch amount.

Furthermore, $K_0 = 2\pi/\Lambda$.

Furthermore, the foregoing Expression (4) includes a Sinc function (Sinc(x)=Sin(x)/x).

In the Sinc function, the positive region including the first peak is a range $-\pi < x < -$.

Figure 8:
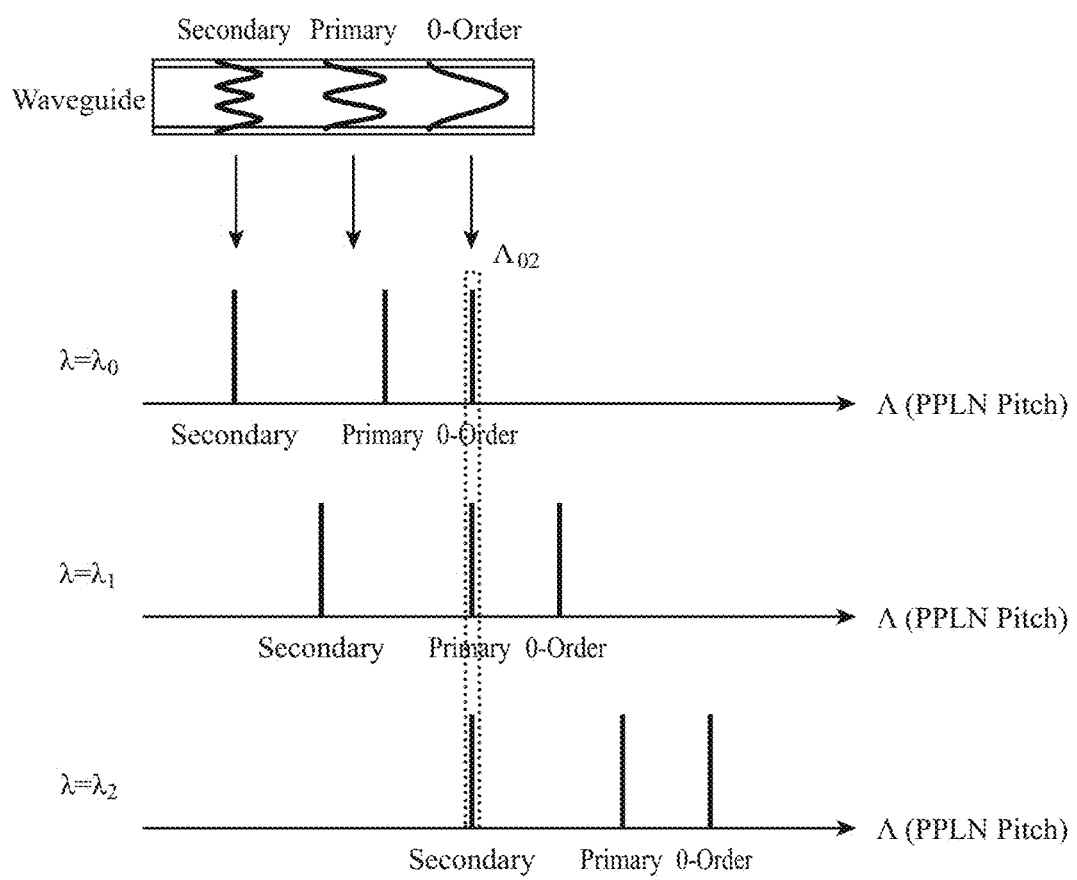
FIG. 8 is a diagram showing relationships between laser oscillation modes with wavelengths $\lambda_0$, $\lambda_1$, $\lambda_2$ and polarization inversion periods within a wavelength conversion element.

FIG. 8 is a diagram showing the relationships between the laser oscillation modes with the wavelengths $\lambda_0$, $\lambda_1$, $\lambda_2$ and the polarization inversion periods (PPLN pitch) in the wavelength conversion element 13.

From Expressions (1), (2) and (3), the polarization inversion period is determined by the thickness of the core composing the waveguide, and the refractive index of the cladding material.

In other words, it is determined by the specifications of the materials composing the waveguide.

Assume that $\Lambda(\lambda_0, 0)$ is the polarization inversion period corresponding to the 0-order mode with the wavelength $\lambda_0$, $\Lambda(\lambda_1, 1)$ is the polarization inversion period corresponding to the primary mode with the wavelength $\lambda_1$, and $\Lambda(\lambda_2, 2)$ is the polarization inversion period corresponding to the secondary mode with the wavelength $\lambda_2$. Then the waveguide is configured by selecting the cladding 132 and the core thickness so that they approach each other, and the polarization inversion period at this time is denoted by $\Lambda_{02}$.

The following Expression (5) shows relational Expression.

It is enough for the pitches $\Lambda(\lambda_0,0)$, $\Lambda(\lambda_1,1)$ and $\Lambda(\lambda_2,2)$ to exist within the phase matching band.

Incidentally, a configuration is also possible in which the pitches $\Lambda(\lambda_0,0)$, $\Lambda(\lambda_1,1)$ and $\Lambda(\lambda_2,2)$ are absolutely equal.

$$\Lambda_{02} \approx \Lambda(\lambda_0,0) \approx \Lambda(\lambda_1,1) \approx \Lambda(\lambda_2,2) \quad (5)$$

The wavelength selecting element 14 selectively reflects the 0-order mode with the wavelength $\lambda_0$, the primary mode with the wavelength $\lambda_1$, and the secondary mode with the wavelength $\lambda_2$.

In other words, it prevents the primary mode and secondary mode with the wavelength $\lambda_0$, the 0-order mode and secondary mode with the wavelength $\lambda_1$, and the 0-order mode and primary mode with the wavelength $\lambda_2$ from being incident to the wavelength conversion element 13.

The 0-order mode with the wavelength $\lambda_0$, the primary mode with the wavelength $\lambda_1$ and the secondary mode with the wavelength $\lambda_2$ within the phase matching band undergo the wavelength conversion to the second harmonics so that the laser beams with the wavelengths $\lambda_0/2$, $\lambda_1/2$, and $\lambda_2/2$ are generated.

Figure 9:
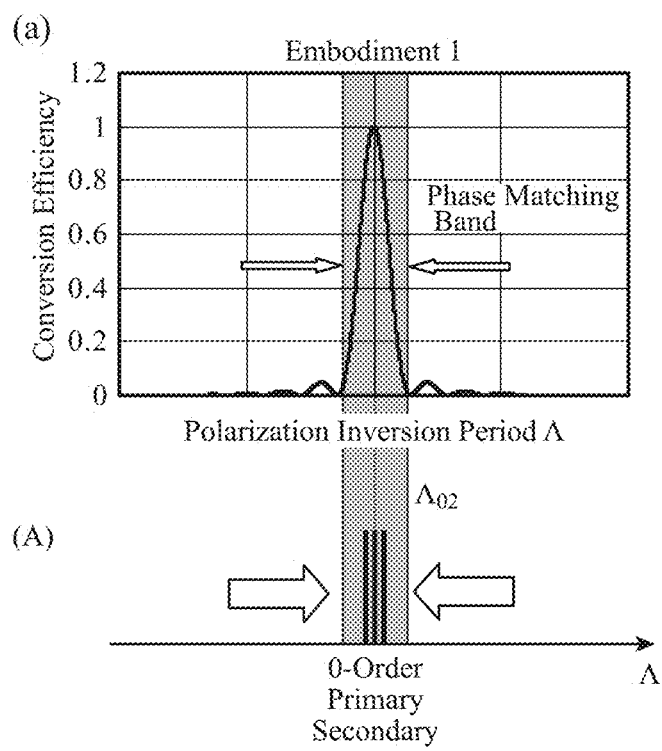
FIG. 9 is a diagram showing relationships between wavelength conversion efficiency and laser oscillation modes of the fundamental waves in the embodiment 1 and in a conventional wavelength conversion element.
Figure 9:
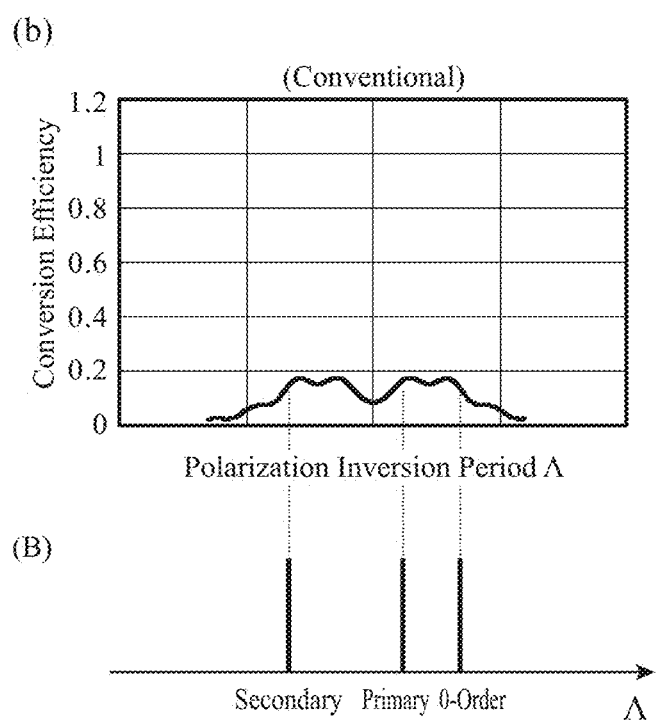

FIG. 9 is a schematic diagram showing the wavelength conversion efficiency of the fundamental waves in the wavelength conversion element 13 with the structure of the present embodiment 1 and with the conventional structure in such a manner as to facilitate understanding the relationships between the wavelength conversion efficiencies and the laser oscillation modes.

As for the wavelength conversion element 13 in the present embodiment 1, an example is shown in which the polarization inversion periods are equal.

FIG. 9(a) shows the characteristics of the wavelength conversion efficiency in this case.

The wavelength conversion efficiencies are normalized to unity by the peak.

The mountainous region including the peaks is designated as a phase matching band.

According to the characteristics of the Sinc function described before, the phase matching band is given by an expression $-\pi < L/2(\Delta k - K_0) < \pi$, and the wavelength conversion element 13 is configured in such a manner that all the $\Lambda(\lambda_0,0)$, $\Lambda(\lambda_1,1)$ and $\Lambda(\lambda_2,2)$ are located within the region.

Thus, the individual laser oscillation modes are adjacent to each other.

On the other hand, FIG. 9(b) shows the characteristics of the wavelength conversion efficiency of a conventional structure. Since the individual laser oscillation modes are not close to each other, the pitch of the polarization inversion must be gradually modified to include them. Thus even though the bandwidth for the polarization inversion period can be increased, the absolute value of the wavelength conversion efficiency reduces even for the peak value.

Incidentally, the conventional conversion efficiency characteristics are also shown by normalizing them by a peak in the case of having a uniform polarization inversion period.

Next, the wavelength conversion efficiencies perceived by the individual laser oscillation modes in which the laser oscillation is made will be described.

In the present embodiment 1, since the 0-order to secondary modes are included within the phase matching band, and the waveguide structure of the wavelength conversion element 13 is optimized so that the individual modes have the close or equal polarization inversion period as shown in Expression (4), the polarization inversion period difference between the individual modes from 0-order to second order is small, and the conversion efficiencies of the individual modes have a large value as shown in FIG. 9(A).

On the other hand, in the conventional structure, the polarization inversion periods of the individual modes from 0-order to second order have different values as shown in FIG. 9(B). Thus the conversion efficiencies the individual modes perceive are small as compared with those of the structure of the present embodiment 1.

Incidentally, although the present embodiment 1 is described using an example that forms the wavelength conversion element 13 at the fixed polarization inversion period, a structure is also possible in which the inversion periods are modified gradually.

When the wavelength conversion element 13 has a structure with the fixed polarization inversion period, the waveguide must be configured in such a manner that when the rays with the wavelengths $\lambda_0$, $\lambda_1$, $\lambda_2$ to be reflected by the wavelength selecting element 13 are incident onto the wavelength conversion element 13, the periods $\Lambda(\lambda_0,0)$, $\Lambda(\lambda_1,1)$ and $\Lambda(\lambda_2,2)$ have a value close to $\Lambda_{02}$ so as to be placed within the phase matching band.

However, as for the structure in which the polarization inversion periods of the wavelength conversion element 13 are gradually varied, it is enough that the periods $\Lambda(\lambda_0,0)$, $\Lambda(\lambda_1,1)$ and $\Lambda(\lambda_2,2)$ are placed within the period modification amount of the polarization inversion period of $\Lambda_{02}$.

Figure 10:
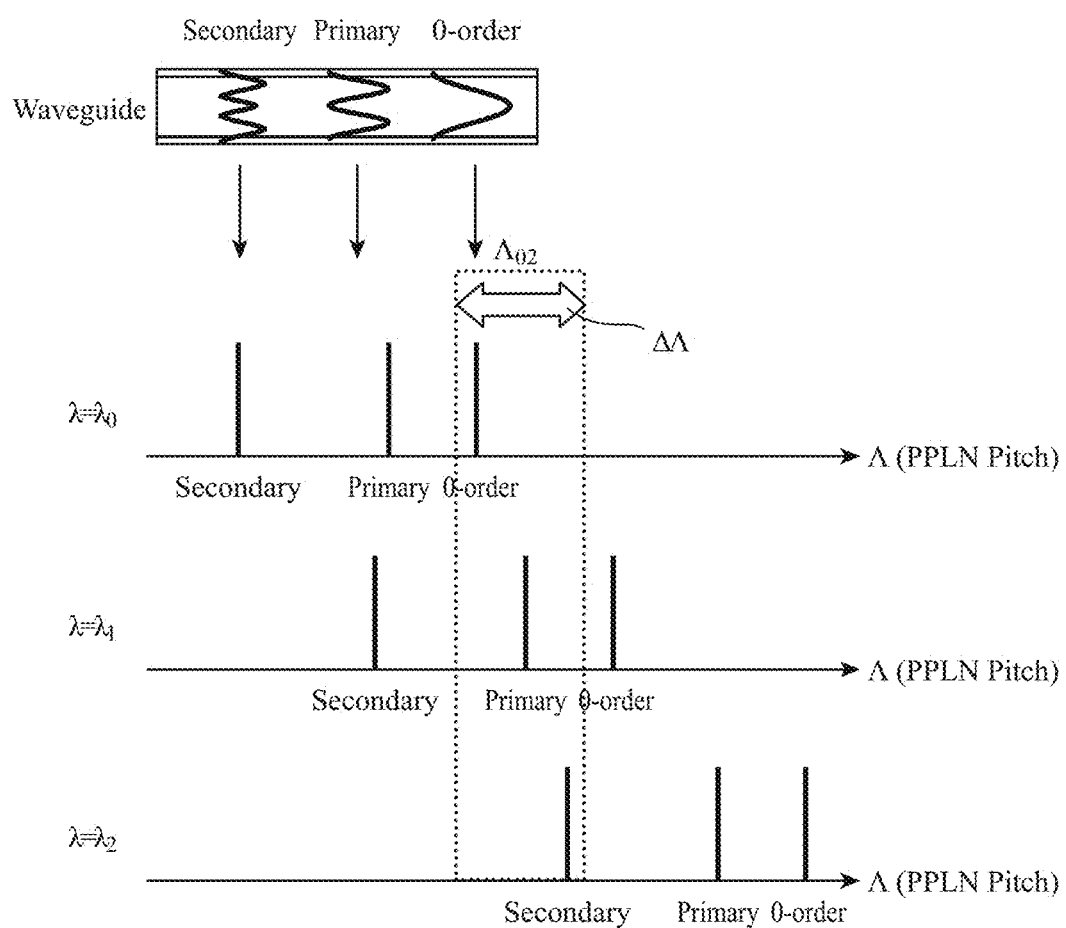
FIG. 10 is a diagram showing relationships between laser oscillation modes with wavelengths $\lambda_0$, $\lambda_1$, $\lambda_2$ and polarization inversion periods within a wavelength conversion element when the wavelength conversion element has a structure with its inversion period varying in a chirped manner.

FIG. 10 is a diagram showing relationships between the laser oscillation modes with the wavelengths $\lambda_0$, $\lambda_1$, $\lambda_2$ and the polarization inversion periods (PPLN pitch) within the wavelength conversion element 13 when the wavelength conversion element 13 has a structure of gradually modifying its inversion periods.

It is assumed that the wavelength conversion element 13 has a central pitch $\Lambda_{02}$, and that the period modification amount over the polarization inversion period is $\Delta\Lambda$, for example.

At this time, the polarization inversion period is gradually increased such as $(\Lambda_{02}-\Delta\Lambda/2)$ to $(\Lambda_{02}+\Delta\Lambda/2)$ from the end face 133a to the end face 133b.

On the contrary, a configuration is also possible in which it is gradually reduced such as $(\Lambda_{02}+\Delta\Lambda/2)$ to $(\Lambda_{02}-\Delta\Lambda/2)$.

Within the wavelength conversion element 13, it is enough that the wavelength conversion periods $\Lambda(\lambda_0,0)$, $\Lambda(\lambda_1,1)$ and $\Lambda(\lambda_2,2)$ with the wavelengths $\lambda_0$, $\lambda_1$ and $\lambda_2$ reflected by the wavelength selecting element 14 are set within the range from $(\Lambda_{02}-\Delta\Lambda/2)$ to $(\Lambda_{02}+\Delta\Lambda/2)$.

In other words, restrictions on the waveguide structure can be eased as compared with the case where the polarization inversion periods are uniform.

Incidentally, although the present embodiment 1 is explained using an example that employs the three wavelengths $\lambda_0$, $\lambda_1$, $\lambda_2$, the laser beams with the wavelengths $\lambda=\lambda_0, \lambda_1, \lambda_2, \ldots, \lambda_n$ ($n \geq 1$) within the oscillation wavelength band of the fundamental wave laser beams are not limited to the three wavelengths, and it goes without saying that it is applicable to any number of wavelengths not less than two wavelengths.

In addition, although the present embodiment 1 shows an example that generates the second harmonics as the function of the wavelength conversion element 13, the present invention is not limited to it. For example, it is obvious that sum frequency generation (SFG) or an optical parametric oscillator (OPO) can offer the same advantages of the present invention.

As described above, according to the present embodiment 1, it comprises the wavelength selecting element 14 that selectively reflects the laser beams with the wavelengths $\lambda=\lambda_0, \lambda_1, \lambda_2, \ldots, \lambda_n$ ($n \geq 1$) of the different laser oscillation modes from among the fundamental oscillation wavelengths of the laser beams passing through the wavelength conversion element 13; and the wavelength conversion element 13 that converts the laser beams with the wavelengths $\lambda=\lambda_0, \lambda_1, \lambda_2, \ldots, \lambda_n$ ($n \geq 1$) of the different laser oscillation modes reflected by the wavelength selecting element 14 to their harmonics.

Accordingly, when it uses a material with a wide gain band as the laser medium 121 of the solid-state laser element 12, it can carry out the high-efficiency wavelength conversion for a plurality of wavelengths within the gain band.

In addition, according to the present embodiment 1, the wavelength selecting element 14 has a waveguide structure including a volume phase grating having a Bragg grating structure formed therein, and has its Bragg grating structure and waveguide structure arranged so as to selectively reflect the laser beams with wavelengths $\lambda=\lambda_0, \lambda_1, \lambda_2, \ldots, \lambda_n$ (n≥1) of the different laser oscillation modes from among fundamental oscillation wavelengths output from the solid-state laser element 12.

Accordingly, the wavelength selecting element 14 can select the laser beams with the wavelengths $\lambda=\lambda_0, \lambda_1, \lambda_2, \ldots, \lambda_n$ (n≥1), and can select the specific mode for each wavelength and reflect it.

Furthermore, according to the present embodiment 1, the wavelength conversion element 13 is a quasi phase matching wavelength conversion element with the non-polarization inversion regions and polarization inversion regions formed therein, and has its polarization inversion period and waveguide structure arranged so that the laser beams with the wavelengths $\lambda=\lambda_0, \lambda_1, \lambda_2, \ldots, \lambda_n$ (n≥1) of different laser oscillation modes are located within the phase matching band each.

Accordingly, it can achieve high wavelength conversion efficiency for the laser beams with the wavelengths $\lambda=\lambda_0, \lambda_1, \lambda_2, \ldots, \lambda_n$ (n≥1).

Furthermore, according to the present embodiment 1, as for the structure of the wavelength conversion element 13, it describes both the example that fixes the polarization inversion period and the example that gradually modifies the polarization inversion periods.

When the polarization inversion period is fixed, it can achieve a large value as the conversion efficiencies the individual modes perceive. In contrast, the structure that gradually modifies the polarization inversion periods can ease the restrictions on the waveguide structure.

Incidentally, it is to be understood that a free combination of the individual embodiments, variations of any components of the individual embodiments or removal of any components of the individual embodiments is possible within the scope of the present invention.

INDUSTRIAL APPLICABILITY

As described above, a waveguide laser in accordance with the present invention is suitable for carrying out the wavelength conversion of laser beams within a planar waveguide.

DESCRIPTION OF REFERENCE SYMBOLS

11 semiconductor laser; 12 solid-state laser element; 13 wavelength conversion element; 14 wavelength selecting element; 121 laser medium; 122, 132, 142 cladding; 131 nonlinear optical material; 141 VBG; 123a, 123b, 133a, 133b, 143a, 143b end face; 134 polarization inversion layer; 144 Bragg layer.

What is claimed is:

1. A waveguide laser comprising:
   a solid-state laser element that amplifies laser beams with a gain achieved by absorption of excitation light, the solid-state laser element including a cladding;
   a wavelength conversion element that converts part of fundamental waves of the laser beams output from the solid-state laser element to harmonics, the wavelength conversion element including a cladding; and
   a wavelength selecting element that selectively reflects laser beams with wavelengths $\lambda=\lambda_0, \lambda_1, \lambda_2, \ldots, \lambda_n$ (n≥1) of different laser oscillation modes from among fundamental oscillation wavelengths of the laser beams passing through the wavelength conversion element, and that outputs harmonics resulting from the conversion by the wavelength conversion element the wavelength selecting element including a cladding, wherein
   the waveguide laser resonates the fundamental waves through an optical resonator structure including the solid-state laser element, the wavelength conversion element and the wavelength selecting element;
   the wavelength conversion element converts the laser beams with the wavelengths $\lambda=\lambda_0, \lambda_1, \lambda_2, \ldots, \lambda_n$ (n≥1) of the different laser oscillation modes reflected by the wavelength selecting element to harmonics; and
   a thickness of the wavelength conversion element and a thickness of the wavelength conversion element cladding are set to establish polarization inversion periods of the wavelength conversion element that conform to the relationship $\Lambda_{02} \approx \Lambda(\lambda_0,0) \approx \Lambda(\lambda_1,1) \approx \Lambda(\lambda_2,2)$.

2. The waveguide laser according to claim 1, wherein the wavelength selecting element has a waveguide structure including a volume phase grating having a Bragg grating structure formed therein, and has its Bragg grating structure and waveguide structure arranged so as to selectively reflect the laser beams with the wavelengths $\lambda=\lambda_0, \lambda_1, \lambda_2, \ldots, \lambda_n$ (n≥1) of different laser oscillation modes from among the fundamental oscillation wavelengths output from the solid-state laser element.

3. The waveguide laser according to claim 1, wherein the wavelength conversion element is a quasi phase matching wavelength conversion element in which non-polarization inversion regions and polarization inversion regions are formed, and has its polarization inversion period and waveguide structure arranged so that the laser beams with the wavelengths $\lambda=\lambda_0, \lambda_1, \lambda_2, \ldots, \lambda_n$ (n≥1) of the different laser oscillation modes are located within a phase matching band each.

4. The waveguide laser according to claim 3, wherein the quasi phase matching wavelength conversion element has a pitch of the polarization inversion periods gradually varied.

5. The waveguide laser according to claim 3, wherein the quasi phase matching wavelength conversion element is comprised of LiNbO3 or LiTaO3 having the polarization inversion.

* * * * *